United States Patent
Yu et al.

(10) Patent No.: US 11,062,897 B2
(45) Date of Patent: Jul. 13, 2021

(54) METAL DOPED CARBON BASED HARD MASK REMOVAL IN SEMICONDUCTOR FABRICATION

(71) Applicant: Lam Research Corporation, Fremont, CA (US)

(72) Inventors: Yongsik Yu, Milpitas, CA (US); David Wingto Cheung, Foster City, CA (US); Kirk J. Ostrowski, San Jose, CA (US); Nikkon Ghosh, San Jose, CA (US); Karthik S. Colinjivadi, San Jose, CA (US); Samantha Tan, Fremont, CA (US); Nathan Musselwhite, Oakland, CA (US); Mark Naoshi Kawaguchi, San Carlos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/640,345

(22) Filed: Jun. 30, 2017

(65) Prior Publication Data
US 2018/0358220 A1  Dec. 13, 2018

Related U.S. Application Data

(60) Provisional application No. 62/517,717, filed on Jun. 9, 2017.

(51) Int. Cl.
*H01L 21/02* (2006.01)
*H01L 21/67* (2006.01)
(Continued)

(52) U.S. Cl.
CPC ........ *H01L 21/02019* (2013.01); *H01J 37/32* (2013.01); *H01L 21/02115* (2013.01);
(Continued)

(58) Field of Classification Search
USPC ........................................................ 438/172
See application file for complete search history.

(56) References Cited

U.S. PATENT DOCUMENTS 5,756,400 A * 5/1998 Ye ..................... B08B 7/0042
134/1.1
6,191,045 B1 * 2/2001 Yoshigai ........... H01L 21/32136
216/72
(Continued)

FOREIGN PATENT DOCUMENTS

JP 2014-007370 1/2014
JP 2014007370 A * 1/2014 ........ H01J 37/32091
(Continued)

OTHER PUBLICATIONS

Morel, et al., "Tungsten metal gate etching in Cl2 /O2 inductively coupled high density plasmas," American Vacuum Society, J. Vac. Sci. Technol. B 26(6), (Nov./Dec. 2008), 8 pages.
(Continued)

*Primary Examiner* — Zandra V Smith
*Assistant Examiner* — Lawrence C Tynes, Jr.
(74) *Attorney, Agent, or Firm* — Weaver Austin Villeneuve & Sampson LLP

(57) ABSTRACT

Methods and apparatuses for etching metal-doped carbon-containing materials are provided herein. Etching methods include using a mixture of an etching gas suitable for etching the carbon component of the metal-doped carbon-containing material and an additive gas suitable for etching the metal component of the metal-doped carbon-containing material and igniting a plasma to selectively remove metal-doped carbon-containing materials relative to underlayers such as silicon oxide, silicon nitride, and silicon, at high temperatures. Apparatuses suitable for etching metal-doped carbon-containing materials are equipped with a high temperature (Continued)

movable pedestal, a plasma source, and a showerhead between a plasma generating region and the substrate.

26 Claims, 5 Drawing Sheets

(51) Int. Cl.
*H01J 37/32* (2006.01)
*H01L 21/677* (2006.01)
*H01L 21/311* (2006.01)
*H01L 21/033* (2006.01)
*C01B 21/083* (2006.01)
*C01B 7/07* (2006.01)

(52) U.S. Cl.
CPC .... *H01L 21/02274* (2013.01); *H01L 21/0332* (2013.01); *H01L 21/31122* (2013.01); *H01L 21/31144* (2013.01); *H01L 21/67167* (2013.01); *H01L 21/67207* (2013.01); *H01L 21/67259* (2013.01); *H01L 21/67748* (2013.01); *C01B 7/0743* (2013.01); *C01B 21/0835* (2013.01); *H01J 2237/334* (2013.01)

(56) References Cited

U.S. PATENT DOCUMENTS

| | | |
|---|---|---|
| 6,930,048 B1 | 8/2005 | Li et al. |
| 9,305,802 B2 | 4/2016 | Kim et al. |
| 9,362,292 B1 | 6/2016 | Liaw |
| 9,520,295 B2 | 12/2016 | Shaikh et al. |
| 2002/0028582 A1* | 3/2002 | Nallan ............ H01L 21/32136 438/710 |
| 2003/0022526 A1* | 1/2003 | Vyvoda ............ H01L 21/32105 438/788 |
| 2005/0028934 A1* | 2/2005 | Miya ................ H01J 37/3244 156/345.33 |
| 2006/0040443 A1* | 2/2006 | Cho ................. H01L 27/10852 438/238 |
| 2006/0169668 A1* | 8/2006 | Samoilov ............ B08B 7/0035 216/58 |
| 2009/0200591 A1* | 8/2009 | Park ................ H01L 27/14621 257/292 |
| 2009/0280267 A1 | 11/2009 | Li et al. |
| 2010/0009533 A1* | 1/2010 | Shaviv ............ H01L 21/76805 438/653 |
| 2010/0279510 A1* | 11/2010 | Nozawa ........... H01L 21/02307 438/710 |
| 2011/0303639 A1* | 12/2011 | Ng .................. H01L 21/32136 216/41 |
| 2011/0306215 A1* | 12/2011 | Ding ................ H01L 21/32137 438/720 |
| 2012/0258261 A1 | 10/2012 | Reddy et al. |
| 2014/0264896 A1* | 9/2014 | Lu .................... H01L 23/5329 257/773 |
| 2015/0056805 A1* | 2/2015 | Park ................ H01L 21/76804 438/672 |
| 2015/0099366 A1* | 4/2015 | Takeda ............ H01J 37/32192 438/710 |
| 2015/0104947 A1* | 4/2015 | Kim ................ H01L 21/31111 438/703 |
| 2015/0200109 A1* | 7/2015 | Kong ............... H01L 21/32139 438/703 |
| 2015/0345642 A1* | 12/2015 | Haas ................ E21B 10/25 427/577 |
| 2016/0027614 A1* | 1/2016 | Manna .............. C23C 16/26 216/49 |
| 2016/0221152 A1* | 8/2016 | Alkhalaileh ....... B24D 18/0009 |
| 2016/0225632 A1 | 8/2016 | Shaikh et al. |
| 2016/0293441 A1* | 10/2016 | Lee ................. H01L 27/1157 |
| 2016/0308112 A1 | 10/2016 | Tan et al. |
| 2016/0314960 A1* | 10/2016 | Cheng .............. H01L 21/32 |
| 2017/0062211 A1 | 3/2017 | Lim et al. |
| 2017/0092505 A1* | 3/2017 | Nakao ............. H01L 21/3065 |
| 2018/0082940 A1* | 3/2018 | Sorensen .......... H01L 23/5226 |
| 2018/0138405 A1* | 5/2018 | McKerrow ........ H01L 45/12 |

FOREIGN PATENT DOCUMENTS

| | | |
|---|---|---|
| KR | 2016/0015157 | 2/2016 |
| KR | 2016/0125912 | 11/2016 |
| TW | 201610203 | 3/2016 |

OTHER PUBLICATIONS

PCT International Search Report and Written Opinion dated Sep. 21, 2018, issued in Application No. PCT/US2018/035878.
International Preliminary Report on Patentability dated Dec. 19, 2020, in Application No. PCT/US2018/035878.

* cited by examiner

METAL DOPED CARBON BASED HARD MASK REMOVAL IN SEMICONDUCTOR FABRICATION

CROSS-REFERENCE TO RELATED APPLICATION

This application claims benefit of U.S. Provisional Patent Application No. 62/517,717, filed Jun. 9, 2017, and titled "METAL DOPED CARBON BASED HARD MASK REMOVAL IN SEMICONDUCTOR FABRICATION," which is incorporated by reference herein in its entirety and for all purposes.

BACKGROUND

Semiconductor fabrication processes for fabricating memory and logic often involve use of hard masks to etch features on the substrate. For example, in some cases, contact holes are formed on a substrate using a patterned hard mask. After the holes are etched on the substrate, the patterned hard mask is removed selective to material underlying the patterned hard mask. However, as devices shrink, and memory and logic technology advances, it is challenging to etch high aspect ratio features using existing hard masks and new technologies for hard masks involve new removal methods.

SUMMARY

Methods and apparatuses for processing semiconductor substrates are provided herein. One aspect involves a method of processing semiconductor substrate having a metal-doped carbon-containing material, the method including: providing a substrate having the metal-doped carbon-containing material to a process chamber; heating the substrate to a temperature between about 200° C. and about 500° C.; and exposing the metal-doped carbon-containing material to a plasma generated from a gas mixture including a first etching gas and a second etching gas to etch the metal-doped carbon-containing material, whereby the first etching gas forms a first volatile by-product with the carbon of the metal-doped carbon-containing material, and the second etching gas forms a second volatile by-product with the metal of the metal-doped carbon-containing material.

In some embodiments, the first etching gas is an oxidant. The first etching gas may include one or more gases. For example, in some embodiments, the first etching gas includes only oxygen gas. In another example, the first etching gas includes only nitrogen gas. In another example, the first etching gas includes only hydrogen gas. In another example, the first etching gas includes only nitrous oxide gas. In another example, the first etching gas includes a combination of oxygen gas and nitrogen gas. In another example, the first etching gas includes a combination of nitrous oxide gas and oxygen gas. In another example, the first etching gas includes a combination of oxygen gas and water vapor. In another example, the first etching gas includes a combination of nitrous oxide gas, oxygen gas, and water vapor. In another example, the first etching gas includes a combination of nitrogen gas and hydrogen gas. In some embodiments, an oxidant is not used in the first etching gas. In some embodiments, a non-oxidant gas is used as the first etching gas. For example, the first etching gas may include only hydrogen gas. In some embodiments, an inert gas is flowed with the first etching gas. Example inert gases include argon and helium.

In various embodiments, the second etching gas is any one or more of nitrogen, nitrogen trifluoride, chlorine, fluorine, bromine, iodine, hydrogen, sulfur hexafluoride, and combinations thereof. In various embodiments, the second etching gas is an additive gas. In various embodiments, the second etching gas includes one or more halogen-containing gases. In some embodiments, an inert gas is flowed with the second etching gas. Example inert gases include argon and helium.

In various embodiments, the substrate is heated to a temperature between about between about 200° C. and about 400° C., such as about 250° C.

In some embodiments, the metal-doped carbon-containing material is etched at an etch rate between about 30 nm/min and about 1000 nm/min.

In various embodiments, the plasma is ignited upstream of a showerhead for delivering the gas mixture. In various embodiments, the plasma is generated using an inductively coupled plasma upstream of the showerhead.

In various embodiments, the plasma generated from the gas mixture to etch the metal-doped carbon-containing material is generated by igniting a plasma at a power per station of between about 500 W and about 10000 W, or between about 3000 W and about 10000 W. In some embodiments, the power is about 7000 W per station.

In some embodiments, the metal-doped carbon-containing material is etched without applying a bias to a pedestal upon which the substrate is placed. In various embodiments, the power applied to the bias is between 0 W and about 3000 W, or between about 10 W and about 3000 W.

In some embodiments, the method is performed at a chamber pressure between about 100 mTorr and about 4000 mTorr. In some embodiments, the chamber pressure is between about 200 mTorr and about 4000 mTorr. In some embodiments, the chamber pressure is between about 1000 mTorr and about 2000 mTorr. In some embodiments, chamber pressure is about 1500 mTorr.

In various embodiments, the substrate is patterned with negative features having an aspect ratio of at least about 5:1, or at least about 20:1, such as between 50:1 and 60:1 or between about 5:1 and about 150:1.

The method may further include, prior to introducing any of the first etching gas or the second etching gas, exposing the substrate to a pre-oxidation gas and igniting a pre-oxidation plasma to protect exposed silicon surfaces on the substrate. The pre-oxidation gas may be a mixture of oxygen gas and nitrogen gas. In some embodiments, the pre-oxidation is performed at a chamber pressure between about 100 mTorr and about 4000 mTorr. In some embodiments, the pre-oxidation is performed at a chamber pressure between about 200 mTorr and about 4000 mTorr. In some embodiments, the pre-oxidation is performed at a chamber pressure between about 1000 mTorr and about 2000 mTorr. In some embodiments, the pre-oxidation is performed at a chamber pressure of about 1500 mTorr. In some embodiments, the flow rate of oxygen gas may be between about 0.1 slm and about 1 slm. In some embodiments, the flow rate of nitrogen gas may be between about 0.1 slm and about 1 slm. The plasma power for an inductively coupled plasma may be between about 500 W and about 6000 W in some embodiments.

In various embodiments, the metal of the metal-doped carbon-containing material is any one or more of tungsten, titanium, tantalum, nitrides thereof, silicides thereof, and combinations thereof. In some embodiments, the metal of the metal-doped carbon-containing material is a transition metal from Period 6 of the Periodic Table of Elements. In some embodiments, the metal-doped carbon-containing material is doped with a tungsten silicide nitride having a chemical formula of $WSi_xN_y$, where $1 \geq x > 0$ and $1 \geq y > 0$.

In various embodiments, the percentage of metal in the metal-doped carbon-containing material is between about 5% and about 95%, or between about 10% and about 70%. In various embodiments, the metal-doped carbon-containing material includes a metal dopant and the composition of the metal dopant in the metal-doped carbon-containing material in atomic percentage is between about 33% and about 66%.

In various embodiments, the metal-doped carbon-containing material includes cross-linked metal atoms and carbon atoms. In some embodiments, the metal-doped carbon-containing material is a tungsten-doped carbon-containing material including cross-linking between tungsten carbide and additional carbon and hydrogen atoms, or between tungsten carbide and additional carbon atoms, or between tungsten carbide and additional hydrogen atoms.

In some embodiments, the metal-doped carbon-containing material is formed by plasma-enhanced chemical vapor deposition by introducing a hydrocarbon precursor gas to a processing chamber and introducing a metal-based precursor gas to a processing chamber and igniting a plasma to deposit the metal-doped carbon-containing hard mask on a substrate where the hydrocarbon precursor gas has a chemical formula of $C_xH_y$, where x is an integer from 2 to 10 and y is an integer from 2 to 24. For example, the hydrocarbon precursor gas may be any of one or more of methane, acetylene, ethylene, propylene, butane, cyclohexane, benzene, and toluene. In various embodiments, the metal-based precursor used during deposition includes a metal halide precursor gas, such as tungsten fluorides ($WF_a$), titanium chlorides ($TiCl_b$), tungsten chlorides ($WCl_c$), hafnium chlorides ($HfCl_d$), and tantalum chlorides ($TaCl_e$), where a, b, c, d, and e are integers greater than or equal to 1. Examples include tetrakis(dimethylamino)titanium (TDMAT) and bis (tert-butylimido)-bis-(dimethylamido)tungsten (BTBMW).

In some embodiments, the metal-doped carbon-containing material is a patterned hard mask used for forming a feature on the substrate and the etch selectivity of metal-doped carbon-containing material to silicon oxide, silicon nitride, doped silicon oxide, doped silicon nitride, tungsten, and combinations thereof is at least about 1000:1.

In some embodiments, the metal-doped carbon-containing material is a patterned hard mask used for forming a feature on the substrate and the etch selectivity of metal-doped carbon-containing material to silicon oxide, silicon nitride, silicon, doped derivatives thereof and combinations thereof is at least about 1000:1.

In some embodiments, the metal-doped carbon-containing material is a patterned hard mask used for forming a feature on the substrate and the etch selectivity of metal-doped carbon-containing material to a silicon oxide, silicon nitride, silicon, germanium, doped derivatives thereof, and combinations thereof is between about 10:1 and about 30:1.

In some embodiments, the metal-doped carbon-containing material is a patterned hard mask used for forming a feature on the substrate and the etch selectivity of metal-doped carbon-containing material to silicon oxide, cobalt, tantalum nitride, copper, and low-k dielectric, and combinations thereof is between about 10:1 and about 30:1.

Another aspect involves a method of etching a tungsten-doped carbon hard mask on a substrate, the method including: providing the substrate having the tungsten-doped carbon hard mask to a process chamber; heating the substrate to a temperature between about 200° C. and about 500° C.; and exposing the tungsten-doped carbon hard mask to a plasma generated from oxygen and chlorine to etch the tungsten-doped carbon hard mask by forming tungsten chlorides or tungsten oxychlorides.

In some embodiments, the plasma is ignited using a power per station of between about 500 W and about 10000 W, or between about 3000 W and about 10000 W. In some embodiments, the power is about 7000 W per station. In various embodiments, the plasma is generated using an inductively coupled plasma upstream of the showerhead.

In various embodiments, the composition of the total flow of gases flowed to the process chamber when exposing the tungsten-doped carbon hard mask to the plasma includes at least about 10% chlorine gas.

In some embodiments, the method is performed at a chamber pressure between about 100 mTorr and about 4000 mTorr. In some embodiments, the chamber pressure is between about 200 mTorr and about 4000 mTorr. In some embodiments, the chamber pressure is between about 1000 mTorr and about 2000 mTorr. In some embodiments, chamber pressure is about 1500 mTorr.

Another aspect involves an apparatus for etching a metal-doped hard mask on a substrate, the apparatus including: a reaction chamber including a pedestal for holding and heating the substrate; a plasma source coupled to the reaction chamber for generating a plasma; one or more first gas inlets coupled to the reaction chamber to deliver a first etching gas to the reaction chamber; one or more second gas inlets coupled to the reaction chamber to deliver a second etching gas to the reaction chamber; and a controller including instructions for performing the following operations: setting the temperature of the pedestal to a temperature between about 200° C. and about 500° C.; introducing a gas mixture including the first etching gas and the second etching gas and igniting a plasma to etch the metal doped carbon-containing material, whereby the first etching gas forms a first volatile by-product with the carbon of the metal-doped carbon-containing material, and the second etching gas forms a second volatile by-product with the metal of the metal-doped carbon-containing material. In various embodiments, the pressure of the reaction chamber is set to a pressure between about 100 mTorr and about 4000 mTorr. In some embodiments, the chamber pressure is between about 200 mTorr and about 4000 mTorr. In some embodiments, the chamber pressure is between about 1000 mTorr and about 2000 mTorr. In some embodiments, chamber pressure is about 1500 mTorr.

Another aspect involves a method of processing semiconductor substrate having a metal-doped silicon-containing material, the method including: providing a substrate having the metal-doped silicon-containing material to a process chamber; heating the substrate to a temperature between about 200° C. and about 500° C.; and exposing the metal-doped silicon-containing material to a plasma generated from a gas mixture including a first etching gas and a second etching gas to etch the metal-doped silicon-containing material, whereby the first etching gas forms a first volatile by-product with the silicon of the metal-doped silicon-containing material, and the second etching gas forms a second volatile by-product with the metal of the metal-doped silicon-containing material.

Another aspect involves a method of etching a tungsten-doped silicon hard mask on a substrate, the method including: providing the substrate having the tungsten-doped silicon hard mask to a process chamber; heating the substrate to a temperature between about 200° C. and about 500° C.; and exposing the tungsten-doped silicon hard mask to a plasma generated from oxygen and chlorine to etch the tungsten-doped silicon hard mask by forming tungsten chlorides or tungsten oxychlorides.

These and other aspects are described further below with reference to the drawings.

DETAILED DESCRIPTION

Figure 1:
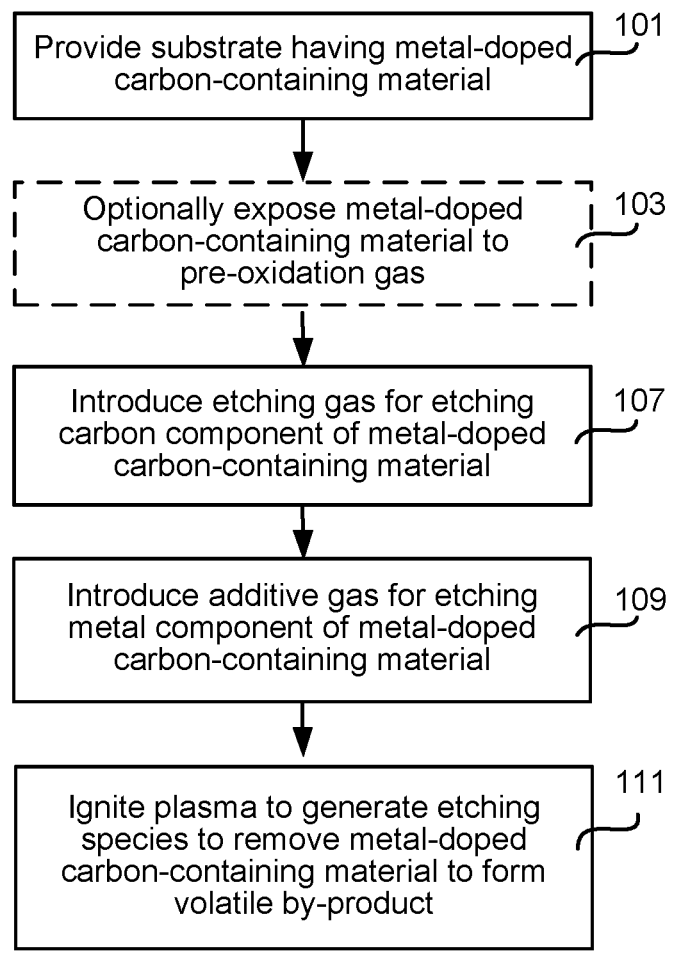
FIG. 1 is a process flow diagram depicting operations for a method performed in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes involve fabrication of memory and logic devices. Examples include 3D NAND and DRAM (dynamic random-access memory) applications, as well as logic applications for mid end of line (MEOL) and back end of line (BEOL) processes. Fabrication of memory and logic devices often involve etching features, such as contact holes, on a substrate, which may include one material or multiple layers of material. "Features" such as via or contact holes may be characterized by one or more of narrow and/or re-entrant openings, constrictions within the feature, and high aspect ratios. The term "feature" as described herein refers to negative features such as holes or vias. Etching features, in many cases, involves depositing and patterning a hard mask over the material to be etched, and etching the material using the hard mask as a pattern. The patterned hard mask may eventually be removed from the substrate.

3D NAND, DRAM, and logic fabrication processes involve using a hard mask to etch contact holes and other negative features on a substrate, which may include one material or be a multi-layered material such as a stack. For example, in 3D NAND fabrication, a channel hole having a critical dimension of about 100 nm may be etched through a 4 micron thick ONON (oxide-nitride-oxide-nitride) substrate using a hard mask, which may be between about 1.5 to about 2 micrometers thick. In DRAM applications, a high aspect ratio feature may be etched for a capacitor using an amorphous silicon or polysilicon hard mask. For example, masks for etching capacitors in DRAM applications are conventionally 1 micrometer to about 1.5 micrometers thick, to form capacitors having a critical dimension between about 20 nm and about 30 nm, and aspect ratios between about 50:1 and about 60:1, depending on the node. In logic applications, a titanium nitride hard mask may be used for MEOL and BEOL applications. Features may be etched to form a contact between a first metal to a second metal. In these applications, a more robust hard mask is used to reduce damage or etching of the hard mask when etching the high aspect ratio features, while maintaining consistent feature diameter throughout the etched feature. It is also desirable to use a hard mask made of material that can be removed without causing defects, redeposition, or damage to the rest of the substrate.

As devices shrink, aspect ratios of these features increase, which causes etching of high aspect ratio negative features to be very challenging while maintaining a hole diameter at the top of the hole consistent with the hole diameter at the bottom of the feature. High aspect ratio as described herein refers to aspect ratios greater than 20:1, such as between 50:1 and 60:1. Example high aspect ratio features include 10:1 holes for a planar NAND, or 40:1 holes for a 3D NAND structure. High aspect ratios are also prevalent in DRAM fabrication. Another challenging aspect of fabricating memory and logic devices is reducing hard mask loss when using the hard mask to etch high aspect ratio features.

Example hard masks include amorphous silicon, polysilicon, amorphous carbon, and titanium nitride hard masks. More recent developments involve using a metal-doped carbon-containing hard mask, also known as metal diamond-like carbon (MDLC) or a metal-doped silicon-containing hard mask. A metal-doped carbon-containing hard mask may be referred to as a metal-doped amorphous carbon hard mask. A metal-doped silicon-containing hard mask may be referred to as a metal-doped amorphous silicon hard mask. Examples of forming metal-doped carbon-containing hard masks or metal-doped silicon-containing hard masks are described in U.S. Pat. No. 9,520,295, which is incorporated by reference herein for all purposes. Metal-doped carbon-containing hard masks include metal atoms and carbon atoms, which may be cross-linked. In some embodiments, metal-doped carbon-containing hard masks having tungsten include cross-linking between tungsten carbide and additional carbon and hydrogen atoms, or between tungsten carbide and additional carbon atoms, or between tungsten carbide and additional hydrogen atoms. The different types of cross-linking observed in a metal-doped carbon-containing hard mask depends on the process conditions for depositing the hard mask, such as deposition precursor chemistry, temperature, chamber pressure, and plasma conditions.

Some metal-doped carbon-containing hard masks may be formed by plasma-enhanced chemical vapor deposition (PECVD) by introducing a hydrocarbon precursor gas to a processing chamber and introducing a metal-based precursor gas to a processing chamber and igniting a plasma to deposit the metal-doped carbon-containing hard mask on a substrate. Hydrocarbon precursors may have the chemical formula $C_xH_y$, where x is an integer from 2 to 10 and y is an integer from 2 to 24. Examples include methane, acetylene, ethylene, propylene, butane, cyclohexane, benzene, and toluene. The metal-based precursor gas may be a metal halide precursor gas. Metal halide precursor gases include tungsten fluorides ($WF_a$), titanium chlorides ($TiCl_b$), tungsten chlorides ($WCl_c$), hafnium chlorides ($HfCl_d$), and tantalum chlorides ($TaCl_e$), where a, b, c, d, and e are integers greater than or equal to 1. Examples include tetrakis(dimethylamino)titanium (TDMAT) and bis(tert-butylimido)-bis-(dimethylamido)tungsten (BTBMW). During deposition of a metal-doped carbon-containing hard mask, a carrier gas may be flowed, such as hydrogen, argon, nitrogen, helium, or combinations thereof. Dopants for metal-doped carbon-containing hard masks include tungsten, titanium, hafnium, and tantalum. In some embodiments, the metal dopants may be any one or more of transition metals in Period 6 of the Periodic Table of Elements. In some embodiments, the dopant is any of tungsten, titanium, tantalum, nitrides thereof, silicides thereof, and combinations thereof. For example, in some embodiments the dopant is a tungsten nitride, or a tungsten silicide.

Metal-doped carbon-containing hard masks are used to form holes in these high aspect ratio applications as they have a higher film density and can withstand etching chemistries used to form the high aspect ratio features without damaging or removing the hard mask as compared to non-doped carbon-containing hard masks. Metal-doped hard masks do not include metalloids.

Additionally, using metal-doped carbon-containing hard masks achieves consistent feature diameters throughout the high aspect ratio features. It will be understood that the term "metal-doped carbon-containing material" described herein refers to material including metal (such as titanium or transition metals in Period 6 of the Periodic Table of Elements including tungsten, tantalum, and hafnium) and carbon, and the amount of metal in the metal-doped carbon-containing material may be any concentration.

However, existing techniques for etching hard masks after using them for patterning are unable to effectively etch the hard mask selectively relative to underlayers. The term "selectivity" used herein refers to material selectivity. For example, if an etching chemistry can achieve a high etch selectivity for a first material relative to a second material, this means the etching chemistry etches the first material faster than it etches the second material. Etch selectivity can be quantified using a ratio of etch rate of the first material to the etch rate of the second material. The etch selectivity depends on the application for which the metal-doped carbon-containing hard mask is being used. For example, in some memory applications, a 5000:1 etch selectivity of metal-doped carbon-containing hard mask relative to silicon oxide or silicon nitride may be achieved, while in some logic applications, a 30:1 etch selectivity of metal-doped carbon-containing hard mask relative to silicon oxide or silicon nitride may be achieved.

Etching techniques include wet and dry etching, but such techniques are unable to both achieve high etch selectivity of the metal-doped carbon-containing hard mask to other material on the substrate (such as dielectric, semiconductor, and metal materials) while reducing or eliminating the presence of defects from etching the metal-doped carbon-containing hard mask. For example, while wet etch solutions containing hydrogen peroxide may remove a high concentration of the metal-doped carbon-containing hard mask with a high etch selectivity (such as about 1000:1), the wet solution can also damage metal surfaces and may also etch some exposed dielectric surfaces. Additionally, dry etching methods for non-doped carbon-containing hard masks involve using oxygen containing oxidizing agents with hydrogen-containing reducing agents, but such techniques cause defects on the substrate. For example, one example etch chemistry for removing non-doped carbon-containing hard masks includes an oxygen plasma, or a combination of plasma conditions with a mixture of oxygen ($O_2$) with forming gas (such as a mixture of hydrogen nitrogen ($H_2/N_2$) and nitrogen trifluoride ($NF_3$)) which has very slow etch rate for metal-doped hard mask and poor selectivity to the dielectric materials. Another example involves a hydrogen peroxide wet etch, which etches between about 30 to 80 nm per minute. Etch selectivity relative to underlying material may be about 1000:1, but, as described above, such etch chemistry causes defects on the substrate.

Provided herein are methods for etching metal-doped hard masks that are used for forming high aspect ratio features for memory and logic applications. While many embodiments described herein refer to removal of metal-doped carbon-containing hard masks, it will be understood that similar techniques may also be used to remove metal-doped silicon-containing hard masks by selecting suitable etching chemistries for etching the silicon component of the metal-doped silicon-containing hard masks in lieu of selecting suitable etching chemistries for etching the carbon component of the metal-doped carbon-containing hard mask.

Certain disclosed embodiments are particularly suitable for removing metal-doped carbon-containing hard masks used in the fabrication of 3D NAND and DRAM structures. Disclosed embodiments involve a high temperature, oxygen-based etching chemistry using additive gases to remove metal-doped carbon-containing hard masks while protecting underlying material on the substrate and reducing the presence of defects.

FIG. 1 provides a process flow diagram depicting operations in a method performed in accordance with certain disclosed embodiments. Embodiments described herein may be performed on a substrate in a process chamber having a chamber pressure between about 100 mTorr and about 4000 mTorr, or between about 200 mTorr and about 4000 mTorr. In some embodiments, the chamber pressure may be between about 1000 mTorr and about 2000 mTorr. For example, in some embodiments, the chamber pressure may be about 1500 mTorr.

In operation 101, a substrate having a metal-doped carbon-containing material is provided. In various embodiments, the metal-doped carbon-containing material is a hard mask.

In various embodiments, the metal of the metal-doped carbon-containing material is tungsten. In some embodiments, the metal-doped carbon-containing material is doped with a metal such as tungsten, titanium, tantalum, nitrides thereof, silicides thereof, and combinations thereof. In some embodiments, the metal-doped carbon-containing material is doped with titanium nitride, tantalum nitride, tungsten nitride, or combinations thereof. In some embodiments, the metal-doped carbon-containing material is doped with a tungsten silicide nitride having a chemical formula of $WSi_xN_y$, where $1 \geq x > 0$ and $1 \geq y > 0$.

In various embodiments, the metal-doped carbon-containing material is patterned and was used to etch features into one or more layers under the metal-doped carbon-containing material. For example, the metal-doped carbon-containing material may have been used to etch features having an aspect ratio of at least about 5:1, or at least about 20:1, or between about 5:1 and about 150:1. In some embodiments, the metal-doped carbon-containing material was used to etch features having an aspect ratio of between about 50:1 and about 60:1. Example high aspect ratio features include 10:1 holes for a planar NAND, or 40:1 holes for a 3D NAND structure.

In various embodiments, the metal-doped carbon-containing material was used to etch feature holes having feature openings between about 10 nm and about 500 nm in width. In various embodiments, the metal-doped carbon-containing material was used to etch features such that features had a difference between the critical dimension at or near the top of the feature and the critical dimension at or near the bottom of the feature of less than about 20 nm, depending on the size of the feature.

In various embodiments, the metal-doped carbon-containing material on the substrate is between about 5 nm and about 2000 nm in thickness, where thickness is measured from the interface of the metal-doped carbon-containing material and the immediately adjacent underlayer to the field surface of the metal-doped carbon-containing material. In 3D NAND applications, the thickness of the metal-doped carbon-containing material to be removed may be between about 1100 nm and about 1300 nm thick. In DRAM applications, the thickness of the metal-doped carbon-containing material to be removed may be between about 300 nm and about 500 nm thick. In logic applications, the thickness of the metal-doped carbon-containing material to be removed may be between about 10 nm and about 20 nm thick.

In some embodiments, the layers on the substrate may be patterned. Features may be formed in one or more of the layers of the substrate. One example of a feature is a hole or via in a semiconductor substrate or a layer on the substrate. Another example is a trench defined by a line or space in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. In some embodiments, the substrate may include multiple layers have different materials such as metals, dielectrics, semiconductor materials, and others. In various embodiments, these materials may be prepared for fabricating contacts, vias, gates, etc.

In various embodiments, the substrate is heated to a selected temperature when provided to the process chamber. It will be understood that the substrate temperature described herein refers to the temperature at which the pedestal holding the substrate is set at. The substrate temperature in certain disclosed embodiments is at least about 200° C., or between about 200° C. and about 500° C., or between about 200° C. and about 400° C., such as about 250° C.

In operation 103, the metal-doped carbon-containing material is optionally exposed to a pre-oxidation gas. Pre-oxidation is an oxygen-based plasma operation used to oxidize the substrate prior to the stripping or removal of the metal-doped carbon-containing hard mask. In various embodiments, pre-oxidation oxidizes exposed silicon surfaces of the substrate. During this operation, the metal-doped carbon-containing material may be exposed to a mixture of oxygen gas and nitrogen gas while igniting a plasma. In some embodiments, the metal-doped carbon-containing material is exposed to a mixture of oxygen gas and nitrous oxide gas while igniting a plasma. In some embodiments, the metal-doped carbon-containing material is exposed to a mixture of nitrogen, hydrogen, and oxygen gas; while igniting a plasma.

During operation 103, the chamber pressure may be between about 100 mTorr and about 4000 mTorr, or between about 200 mTorr and about 4000 mTorr. In some embodiments, the chamber pressure may be between about 1000 mTorr and about 2000 mTorr. For example, in some embodiments, the chamber pressure may be about 1500 mTorr.

For flowing a mixture of oxygen gas and nitrogen gas, example flow rates for oxygen gas may be between 2 about 0.1 slm and about 1 slm, and example flow rates for nitrogen gas may be between about 0.1 slm and about 1 slm. The plasma power for an inductively coupled plasma may be between about 500 W and about 6000 W in some embodiments.

This may be particularly suitable for removing a metal-doped carbon-containing material used during fabrication of a 3D NAND structure to protect the underlying silicon material. The oxygen species react with the silicon and oxidize it. The chlorine-based metal-doped carbon-containing material strip process etches silicon oxide at 1% of the rate it etches the silicon, which minimizes loss of the substrate.

In operation 107, a first etching gas is introduced. The etching gas includes a gas suitable for etching the carbon component of the metal-doped carbon-containing material. In various embodiments, the etching gas is an oxidant. The etching gas includes one or more gases. In some embodiments, the etching gas is provided as a mixture. Example etching gases that may be used in operation 107 include oxygen gas only; nitrogen gas only; hydrogen gas only; nitrous oxide gas only; a combination of oxygen and nitrogen; a combination of nitrous oxide and oxygen; a combination of oxygen and vapor; a combination of nitrous oxide, oxygen, and water vapor; and a combination of nitrogen and hydrogen. An oxidant is not required. In some embodiments, the removal of metal-doped carbon-containing hard mask can be performed without performing operation 107. For embodiments where a metal-doped silicon-containing material is etched, a suitable etch chemistry may be selected for etching the silicon component of the metal-doped silicon-containing material. In some embodiments, an inert gas is flowed with the etching gas. Example inert gases include argon and helium.

In operation 109, an additive gas is introduced. The additive gas may be referred to herein as a second etching gas. In various embodiments, the additive gas is introduced while introducing the etching gas in operation 107. The additive gas includes one or more gases suitable for etching the metal component of the metal. Example additive gases include nitrogen, nitrogen trifluoride, chlorine, fluorine, bromine, iodine, hydrogen, sulfur hexafluoride, and combinations thereof.

In some embodiments, for a tungsten-doped carbon-containing material, the additive gas is includes one or more halogen-containing gases. Example halogen-containing gases for etching a tungsten-doped carbon-containing material include nitrogen trifluoride, chlorine, sulfur hexafluoride, and combinations thereof. These additive gases may also be suitable for etching a metal-doped carbon-containing material that includes tungsten nitride or tungsten silicide nitride. In some embodiments, an inert gas is flowed with the additive gas. Example inert gases include argon and helium.

In various embodiments, operations 107 and 109 are performed together such that the etching gas and additive gas are provided to a process chamber housing the substrate simultaneously as a gas mixture. In some embodiments, an etching gas is flowed followed by flowing an additive gas. In some embodiments, an additive gas is flowed followed by flowing an etching gas.

In various embodiments where a mixture of etching gas and additive gas are provided, the relative amounts of the etching gas and additive gas may be tailored depending on the density of dopants in the metal-doped carbon-containing material. In various embodiments, the amount of etching gas in the mixture of etching gas and additive gas may range from about 5% (5% etching gas and 95% additive gas) to about 100% (where no additive gas is used) of the total amount of the mixture of etching gas and additive gas. The amount of etching gas in the mixture of etching gas and additive gas may range from about 10% to about 70% of the total amount of the mixture of etching gas and additive gas. In some embodiments, the amount of etching gas is at least about 10%, or about 25%, or about 40%, or about 44%, or about 50%, or between about 25% and about 50%. The amount of gas flowed to the substrate may be measured by evaluating the flow rate of the gas to the process chamber. For a higher density of dopants in a metal-doped carbon-containing material, a higher flow rate of the additive gas may be used relative to the etching gas. For example, for a metal-doped carbon-containing material with a dopant density of about 33% tungsten where, the ratio of etching gas to additive gas for removal of the metal-doped carbon-containing material is about 2:1. In some embodiments, the dopant density is measured by percentage, which is an atomic percentage for composition of the material. In some embodiments, the percentage of metal in the metal-doped carbon-containing material is between about 5% and about 95% of the composition of the material. In some embodiments, the amount of tungsten in a tungsten-doped carbon-containing material may be between about 33% and about 66% of the composition of the material. In certain embodiments, a tungsten-doped carbon-containing material may be doped with about 33% tungsten, or about 63% tungsten. In some cases, dopant density is provided in atoms per unit volume. For materials having an impurity level of dopants, the amount of dopants in the material may be referred to as a doping concentration or dopant density measured in atoms per $cm^3$.

In operation 111, a plasma is ignited from the etching and additive gases to form an etching species that removes the metal-doped carbon-containing material to form one or more volatile by-products. Volatile by-products include tungsten chlorides and tungsten oxychlorides. For example, in some embodiments, the volatile byproducts formed may include one or more of tungsten (VI) oxytetrachloride ($WOCl_4$) (boiling point=227° C.), tungsten pentachloride ($WCl_5$) (boiling point=275° C.), and tungsten hexachloride ($WCl_6$) (boiling point=347° C.).

One skilled in the art will recognize that the actual species present in the plasma may be a mixture of different ions, radicals, and molecules derived from the etching and additive gases. It is noted that other species may be present in the reaction chamber during the removal of the metal-doped carbon-containing material, such as the volatile by-products generated from reacting the metal-doped carbon-containing material with the etching gas and additive gas as the plasma reacts with and breaks down the metal-doped carbon-containing material. The initial one or more gases introduced into the plasma may be different from the one or more gases that exist in the plasma as well as the one or more gases that contact the surface of the substrate during etching.

Various types of plasma sources may be used including RF, DC, and microwave based plasma sources. In some embodiments, an RF plasma source is used. Typically, the RF plasma power for a 300 mm wafer ranges between about 500 W and about 10000 W, or between about 3000 W and about 10000 W. In some embodiments, the power is about 7000 W per station. Depending on the process chamber being used, in some embodiments, each station has a dedicated power source. In various embodiments, the plasma is generated as an inductively coupled plasma upstream of the showerhead.

In various embodiments, a bias is not applied to the pedestal during etching of the metal-doped carbon-containing material. However, in some embodiments, a 13.56 MHz RF bias is used. An RF bias may be used to help oxidize the substrate at the bottom of a high aspect ratio feature, but in some embodiments where the aspect ratio is less than 10:1, a bias may not be necessary to help oxide the substrate. The use of a bias depends on the chemistry and whether directional etching is used in the application of using certain disclosed embodiments. If a bias is applied, the power applied to the bias may be between about 10 W and about 3000 W, such as about 10 W. It will be understood that the terms "bias power" and "bias voltage" are used interchangeably herein to describe the voltage for which a pedestal is set when a bias is applied to the pedestal. Bias power or bias voltage as described herein is measured in watts for the power applied to the pedestal.

In some embodiments, the etch rate of the metal-doped carbon-containing hard mask is between about 30 nm/min and about 1000 nm/min.

In various embodiments, the chamber pressure may be between about 100 mTorr and about 4000 mTorr, or between about 200 mTorr and about 4000 mTorr. In some embodiments, the chamber pressure may be between about 1000 mTorr and about 2000 mTorr. For example, in some embodiments, the chamber pressure may be about 1500 mTorr. The chamber pressure affects the etch rate. The higher the chamber pressure, the greater the etch rate.

Process conditions and chemistries of the etching and additive gases are selected such that the metal-doped carbon-containing material is selectively etched relative to other material on the substrate. As noted above, selectivity is defined as material selectivity, whereby selective etching to a first material relative to a second material indicates that the etch rate for the first material is higher than the etch rate of the second material such that little or none of the second material is etched.

For 3D NAND applications, the metal-doped carbon-containing material is removed selective to exposed oxide, nitride, silicon, and doped derivatives thereof. For DRAM applications, the metal-doped carbon-containing material is removed selective to oxide, nitride, tungsten, and doped derivatives thereof. For MEOL logic applications, the metal-doped carbon-containing material is removed selective to oxide, nitride, silicon, germanium, and doped derivatives thereof. For BEOL logic applications, the metal-doped carbon-containing material is removed relative to doped oxides, undoped oxide, cobalt, tantalum nitride, copper, and low-k dielectrics.

Etch selectivity of metal-doped carbon-containing material relative to tetraethyl orthosilicate-deposited (TEOS-deposited) oxide using certain disclosed embodiments may be at least about 1000:1. TEOS-deposited oxide is defined as oxide deposited using tetraethyl orthosilicate (TEOS) as the silicon-containing precursor. For example, TEOS-deposited oxide may be deposited using TEOS and an oxygen-containing reactant by chemical vapor deposition, atomic layer deposition, or plasma-enhanced techniques thereof. In logic applications, the etch selectivity of metal-doped carbon-containing material relative to other material on the substrate using certain disclosed embodiments may be at least about 10:1, or between about 10:1 and about 30:1.

The additive gas in operation 109 and etching gas in operation 107 are selected such that when a plasma is ignited, the metal-doped carbon-containing material reacts with the etching gas and additive gas to form a volatile by-product.

In various embodiments, the plasma is generated in an inductively coupled plasma in the showerhead prior to delivering the etching species to the substrate. In such embodiments, the etching and additive gases are provided to the showerhead, where a plasma is ignited, and the etching species then flows through holes in the showerhead to the substrate in the process chamber. In some embodiments, the etch selectivity is increased by modulating the distance between the showerhead and the wafer to thereby reduce damage caused by plasma on surfaces of the substrate that are not to be etched. In various embodiments, using an inductively coupled plasma reduces the etch rate on material that is not the metal-doped carbon-containing material to achieve a largely chemical etch providing enough etching species to remove the metal-doped carbon-containing material and form volatile byproducts without causing redeposition or defects. In various embodiments, use of a direct plasma may result in high material loss so in some embodiments a remote plasma or an ICP plasma generated in the showerhead may be used to reduce the damage to the material on the substrate. The modulation of the plasma conditions and the distance between the wafer and the showerhead allows for low energy ions from the etching species to etch the metal-doped carbon-containing material selectively relative to other non-metal-doped carbon-containing material on the substrate.

Apparatus

Disclosed embodiments may be performed in any suitable etching chamber or apparatus, such as the Argos, available from Lam Research Corporation of Fremont, Calif. Further description of plasma etch chambers may be found in U.S. Pat. Nos. 6,841,943 and 8,552,334, which are herein incorporated by reference in their entireties.

Disclosed embodiments are performed in an inductively coupled plasma (ICP) reactor. One example is provided in FIG. 2. Such ICP reactors have also been described in U.S. Pat. No. 9,362,133 issued Jun. 7, 2016, filed Dec. 10, 2013, and titled "METHOD FOR FORMING A MASK BY ETCHING CONFORMAL FILM ON PATTERNED ASHABLE HARDMASK," hereby incorporated by reference for the purpose of describing a suitable ICP reactor for implementation of the techniques described herein. Although ICP reactors are described herein, in some embodiments, it should be understood that capacitively coupled plasma reactors may also be used. An example etching chamber or apparatus may include a chamber having chamber walls, a chuck for holding a substrate or wafer to be processed which may include electrostatic electrodes for chucking and dechucking a wafer and may be electrically charged using a radio frequency (RF) power supply, an RF power supply configured to supply power to a coil to generate a plasma, and gas flow inlets for inletting gases as described herein. For example, etching gases and additive gases as well as pre-oxidation gases may be flowed to the etching chamber for performing selective etching of metal-doped carbon-containing material. In some embodiments, an apparatus may include more than one chamber, each of which may be used to etch, deposit, or process substrates. The chamber or apparatus may include a system controller for controlling some or all of the operations of the chamber or apparatus such as modulating the chamber pressure, inert gas flow, plasma power, plasma frequency, reactive gas flow (e.g., oxidant gas, etching gas, additive gas, etc.); bias power, temperature, vacuum settings; and other process conditions. The chamber may also be used to selectively deposit carbon-containing material onto a substrate.

Figure 2:
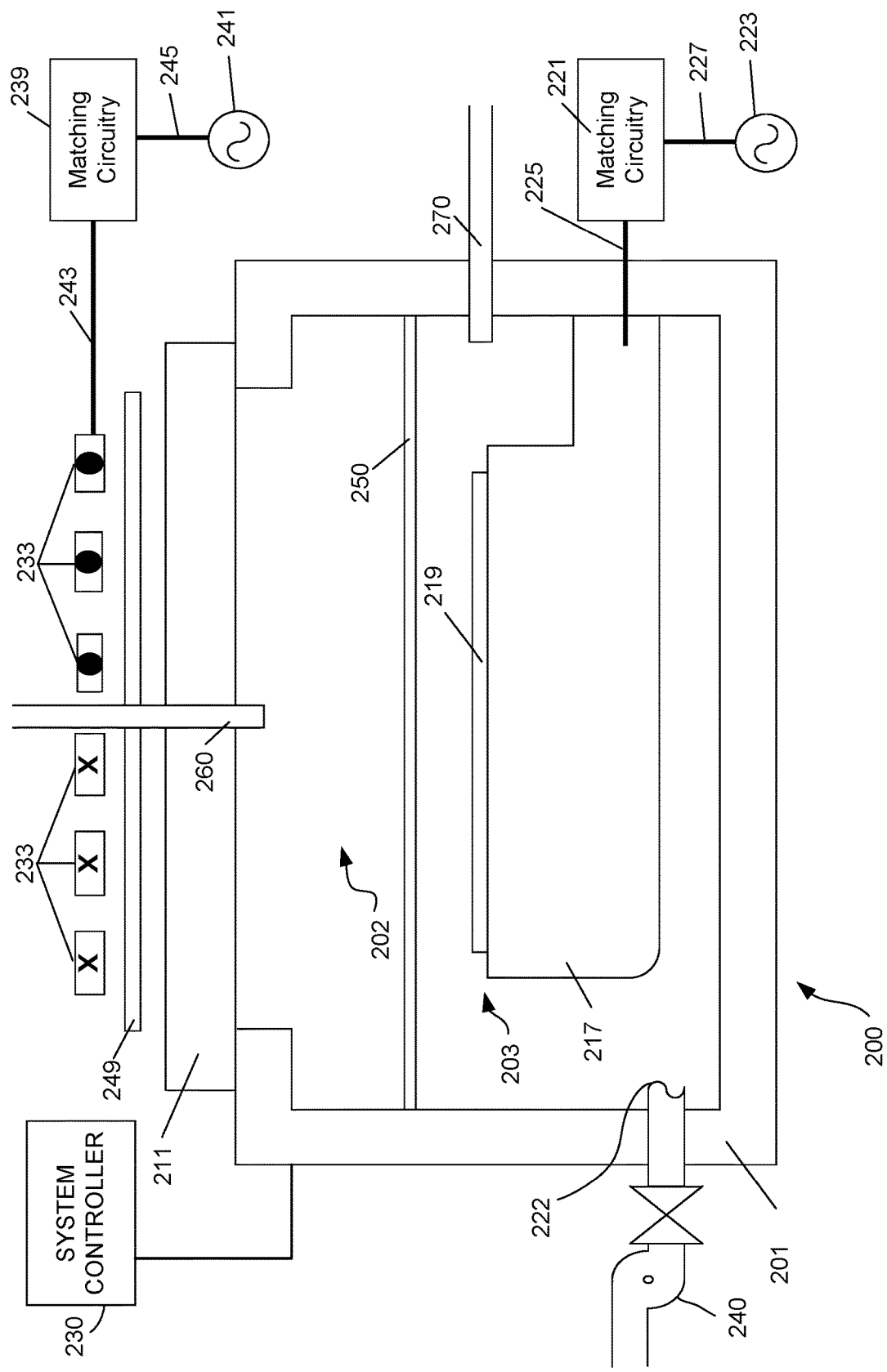
FIG. 2 is a schematic diagram of an example process chamber for performing certain disclosed embodiments.

FIG. 2 schematically shows a cross-sectional view of an inductively coupled plasma integrated etching and deposition apparatus 200 appropriate for implementing certain embodiments herein, an example of which is an inductively coupled plasma reactor, produced by Lam Research Corp. of Fremont, Calif. The inductively coupled plasma apparatus 200 includes a processing chamber 201 structurally defined by chamber walls and a window 211. The chamber walls may be fabricated from stainless steel or aluminum. The window 211 may be fabricated from quartz or other dielectric material. An optional internal showerhead 250 divides the processing chamber 201 into an upper sub-chamber 202 and a lower sub-chamber 203. The showerhead may include one hole, or may include multiple holes for delivering and distributing gases and/or plasma species to lower sub-chamber 203. In most embodiments, showerhead 250 may be removed, thereby utilizing a chamber space made of sub-chambers 202 and 203. A chuck 217 is positioned within the lower sub-chamber 203 near the bottom inner surface. The chuck 217 is configured to receive and hold a semiconductor wafer 219 upon which the etching and deposition processes are performed. The chuck 217 can be an electrostatic chuck for supporting the wafer 219 when present. In some embodiments, an edge ring (not shown) surrounds chuck 217, and has an upper surface that is approximately planar with a top surface of a wafer 219, when present over chuck 217. The chuck 217 also includes electrostatic electrodes for chucking and dechucking the wafer. A filter and DC clamp power supply (not shown) may be provided for this purpose. Other control systems for lifting the wafer 219 off the chuck 217 can also be provided. The chuck 217 may be movable along an axis substantially parallel to the sidewalls of the chamber whereby the surface of the chuck 217 is substantially parallel to the ground. In some embodiments, the distance between the plasma source and the wafer 219 on the chuck 217 may be between about 4 inches and about 5 inches. Such a distance may allow for high etch rate of the metal-doped carbon-containing hard mask on the wafer 219. If a showerhead is used, the distance between the wafer 219 and the showerhead (not shown) may be between about 0.5 inches and about 3.0 inches. The chuck 217 can be electrically charged using an RF power supply 223. The RF power supply 223 is connected to matching circuitry 221 through a connection 227. The matching circuitry 221 is connected to the chuck 217 through a connection 225. In this manner, the RF power supply 223 is connected to the chuck 217.

Elements for plasma generation include a coil 233 is positioned above window 211. In various embodiments, a coil is not used in disclosed embodiments. The coil 233 is fabricated from an electrically conductive material and includes at least one complete turn. The example of a coil 233 shown in FIG. 2 includes three turns. The cross-sections of coil 233 are shown with symbols, and coils having an "X" extend rotationally into the page, while coils having a "●" extend rotationally out of the page. Elements for plasma generation also include an RF power supply 241 configured to supply RF power to the coil 233. In general, the RF power supply 241 is connected to matching circuitry 239 through a connection 245. The matching circuitry 239 is connected to the coil 233 through a connection 243. In this manner, the RF power supply 241 is connected to the coil 233. An optional Faraday shield 249 is positioned between the coil 233 and the window 211. The Faraday shield 249 is maintained in a spaced apart relationship relative to the coil 233. The Faraday shield 249 is disposed immediately above the window 211. The coil 233, the Faraday shield 249, and the window 211 are each configured to be substantially parallel to one another. The Faraday shield may prevent metal or other species from depositing on the dielectric window of the processing chamber 201.

Process gases (e.g. oxygen, nitrogen, chlorine, etc.) may be flowed into the processing chamber 201 through one or more main gas flow inlets 260 positioned in the sub-upper chamber 202 and/or through one or more side gas flow inlets 270. Likewise, though not explicitly shown, similar gas flow inlets may be used to supply process gases to a capacitively coupled plasma processing chamber. A vacuum pump, e.g., a one or two stage mechanical dry pump and/or turbomolecular pump 240, may be used to draw process gases out of the processing chamber 201 and to maintain a pressure within the processing chamber 201. For example, the pump may be used to evacuate the processing chamber 201 to remove volatile by-products generated from the etching chemistry reacting with the metal-doped carbon-containing material. A valve-controlled conduit may be used to fluidically connect the vacuum pump to the processing chamber 201 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 260 and/or 270. In certain embodiments, process gas may be supplied only through the main gas flow inlet 260, or only through the side gas flow inlet 270. In some cases, the gas flow inlets shown in the figure may be replaced by more complex gas flow inlets, one or more showerheads, for example. The Faraday shield 249 and/or optional grid 250 may include internal channels and holes that allow delivery of process gases to the processing chamber 201. Either or both of Faraday shield 249 and optional grid 250 may serve as a showerhead for delivery of process gases. In some embodiments, a liquid vaporization and delivery system may be situated upstream of the processing chamber 201, such that once a liquid reactant or precursor is vaporized, the vaporized reactant or precursor is introduced into the processing chamber 201 via a gas flow inlet 260 and/or 270.

Radio frequency power is supplied from the RF power supply 241 to the coil 233 to cause an RF current to flow through the coil 233. The RF current flowing through the coil 233 generates an electromagnetic field about the coil 233. The electromagnetic field generates an inductive current within the upper sub-chamber 202. The physical and chemical interactions of various generated ions and radicals with the wafer 219 selectively etch features of and deposit layers on the wafer.

If the plasma grid is used such that there is both an upper sub-chamber 202 and a lower sub-chamber 203, the inductive current acts on the gas or gases present in the upper sub-chamber 202 to generate an electron-ion plasma in the upper sub-chamber 202. The optional internal plasma grid 250 limits the amount of hot electrons in the lower sub-chamber 203. In some embodiments, the apparatus is designed and operated such that the plasma present in the lower sub-chamber 203 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 203 through port 222. The chuck 217 disclosed herein may operate at elevated temperatures ranging between about 200° C. and about 500° C. The temperature will depend on the process operation and specific recipe.

Processing chamber 201 may be coupled to facilities (not shown) when installed in a clean room or a fabrication facility. Facilities include plumbing that provide processing gases, vacuum, temperature control, and environmental particle control. These facilities are coupled to processing chamber 201, when installed in the target fabrication facility. Additionally, processing chamber 201 may be coupled to a transfer chamber that allows robotics to transfer semiconductor wafers into and out of processing chamber 201 using typical automation.

In some embodiments, a system controller 230 (which may include one or more physical or logical controllers) controls some or all of the operations of a processing chamber. The system controller 230 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

The processing chamber 201 or apparatus may include a system controller. For example, in some embodiments, a controller 230 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 230, depending on the processing specification and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 230 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 230, in some implementations, may be a part of or coupled to a computer that is integrated with, coupled to the system, otherwise networked to the system, or a combination thereof. For example, the controller 230 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 230 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 3:
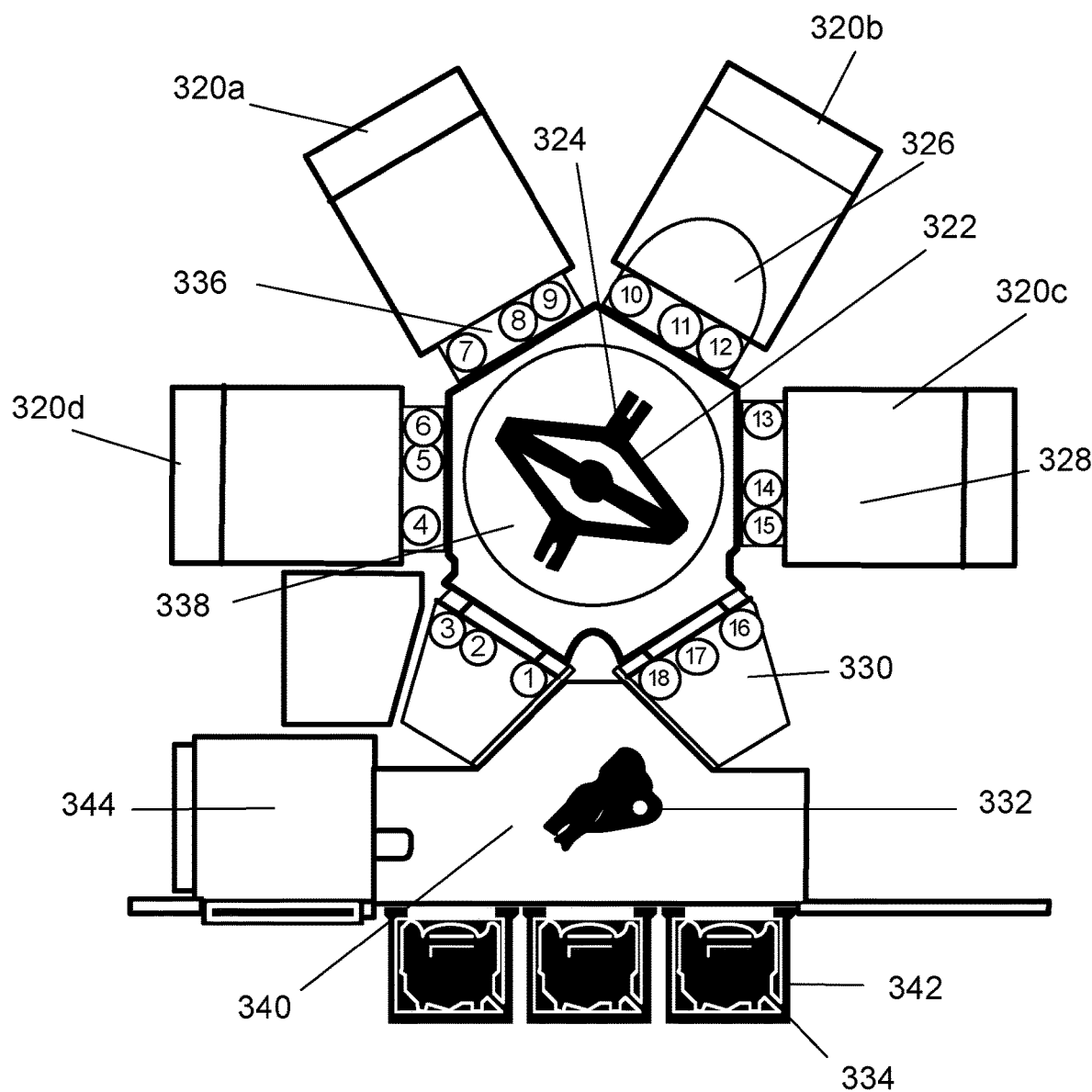
FIG. 3 is a schematic diagram of an example process tool for performing certain disclosed embodiments.

The processing chamber 201 may be integrated in a multi-station tool such as shown in FIG. 3. Each station may be used to process different operations. For example, one station may be used to perform pre-oxidation while another station is used to perform selective etching of the metal-doped carbon-containing material. Disclosed embodiments may be performed without breaking vacuum and may be performed in the same apparatus.

FIG. 3 depicts a semiconductor process cluster architecture with various modules that interface with a vacuum transfer module 338 (VTM). The arrangement of transfer modules to "transfer" wafers among multiple storage facilities and processing modules may be referred to as a "cluster tool architecture" system. Airlock 330, also known as a loadlock or transfer module, is shown in VTM 338 with four processing modules 320a-320d, which may be individual optimized to perform various fabrication processes. By way of example, processing modules 320a-320d may be implemented to perform substrate etching, deposition, ion implantation, wafer cleaning, sputtering, and/or other semiconductor processes. One or more of the substrate etching processing modules (any of 320a-320d) may be implemented as disclosed herein, i.e., for performing pre-oxidation, selectively removing metal-doped carbon-containing material, and other suitable functions in accordance with the disclosed embodiments. Airlock 330 and process module 320 may be referred to as "stations." Each station has a facet 336 that interfaces the station to VTM 338. Inside each facet, sensors 1-18 are used to detect the passing of wafer 326 when moved between respective stations.

Robot 322 transfers wafer 326 between stations. In one embodiment, robot 322 has one arm, and in another embodiment, robot 322 has two arms, where each arm has an end effector 324 to pick wafers such as wafer 326 for transport. Front-end robot 332, in atmospheric transfer module (ATM) 340, is used to transfer wafers 326 from cassette or Front Opening Unified Pod (FOUP) 334 in Load Port Module (LPM) 342 to airlock 330. Module center 328 inside process module 320 is one location for placing wafer 326. Aligner 344 in ATM 340 is used to align wafers.

In an exemplary processing method, a wafer is placed in one of the FOUPs 334 in the LPM 342. Front-end robot 332 transfers the wafer from the FOUP 334 to an aligner 344, which allows the wafer 326 to be properly centered before it is etched or processed. After being aligned, the wafer 326 is moved by the front-end robot 332 into an airlock 330. Because airlock modules have the ability to match the environment between an ATM and a VTM, the wafer 326 is able to move between the two pressure environments without being damaged. From the airlock module 330, the wafer 326 is moved by robot 322 through VTM 338 and into one of the process modules 320a-320d. In order to achieve this wafer movement, the robot 322 uses end effectors 324 on each of its arms. Once the wafer 326 has been processed, it is moved by robot 322 from the process modules 320a-320d to an airlock module 330. From here, the wafer 326 may be moved by the front-end robot 332 to one of the FOUPs 334 or to the aligner 344.

The computer controlling the wafer movement can be local to the cluster architecture, or can be located external to the cluster architecture in the manufacturing floor, or in a remote location and connected to the cluster architecture via a network. A controller as described above with respect to FIG. 2 may be implemented with the tool in FIG. 3.

EXPERIMENTAL

Experiment 1

An experiment was conducted on a substrate having a tungsten-doped carbon hard mask which was used for patterning high aspect ratio vias in a substrate. The substrate was heated to a temperature between 200° C. and 400° C. in a chamber having a pressure between 0.5 Torr and 6.0 Torr and the tungsten-doped carbon hard mask was exposed to a mixture of oxygen gas and chlorine gas, where the chlorine was about 10% to 40% of the total flow. Plasma was ignited at a power of about 2000 W to 5000 W using no bias (power applied to bias=0 W). About 1 micron of the tungsten-doped carbon hard mask was etched, with little defects on the surface and clean removal of the tungsten-doped carbon hard mask.

Experiment 2

Figure 4:
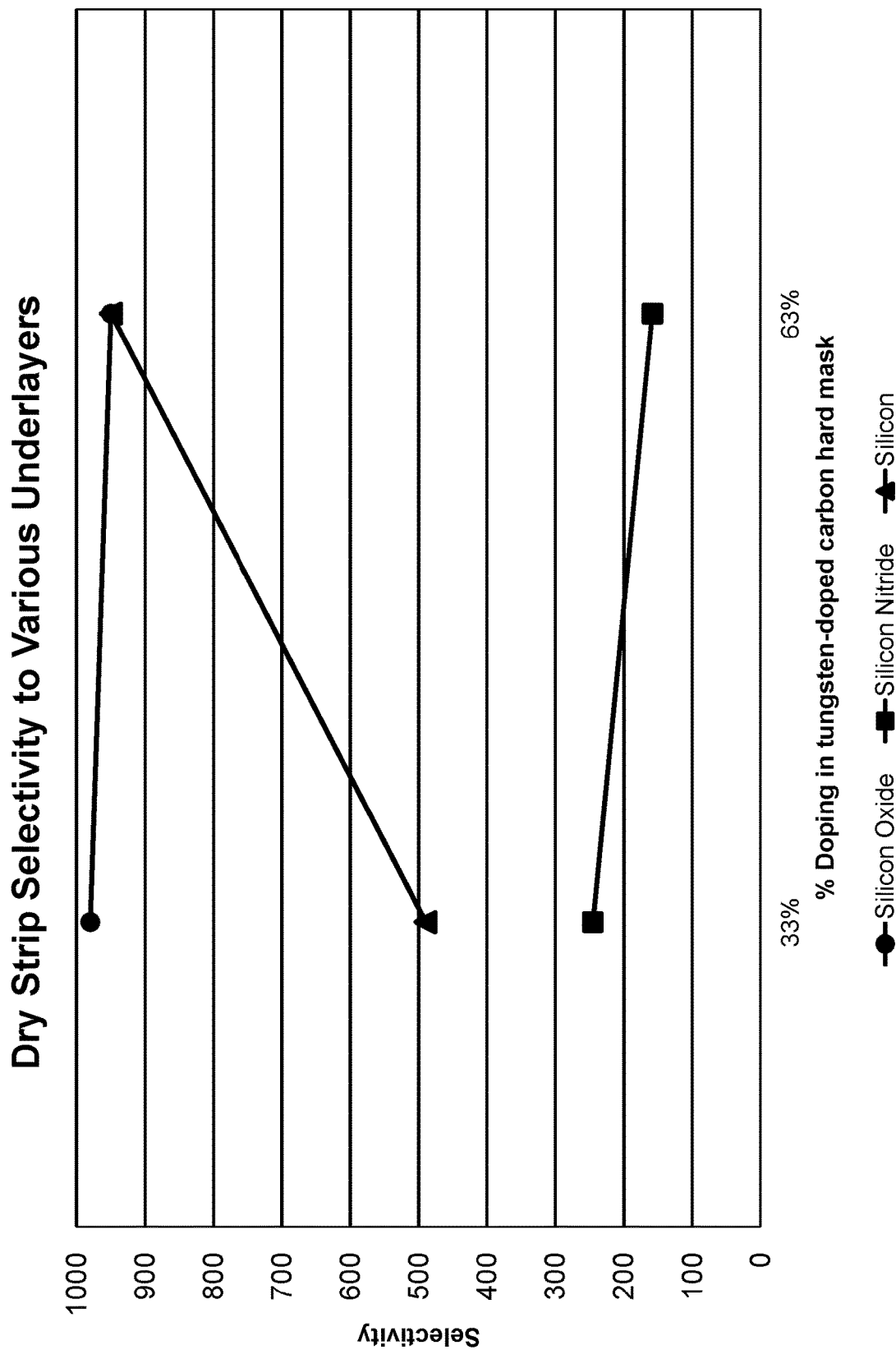
FIG. 4 is a graph depicting etch selectivity results for an experiment conducted in accordance with certain disclosed embodiments.

An experiment was conducted on 33% doped tungsten-doped carbon hard masks and 63% doped tungsten-doped carbon hard masks over three different substrate materials—silicon oxide, silicon nitride, and silicon. The strip rate for both 33% and 63% tungsten doped films was about 95 nm/minute. Etch selectivity was determined for these six trials, and FIG. 4 provides a chart of the results.

These results suggest that near 1000:1 etch selectivity is achievable for removing tungsten-doped carbon hard masks relative to silicon oxide material, and high etch selectivity is also achievable relative to silicon nitride and silicon materials.

Experiment 3

Figure 5:
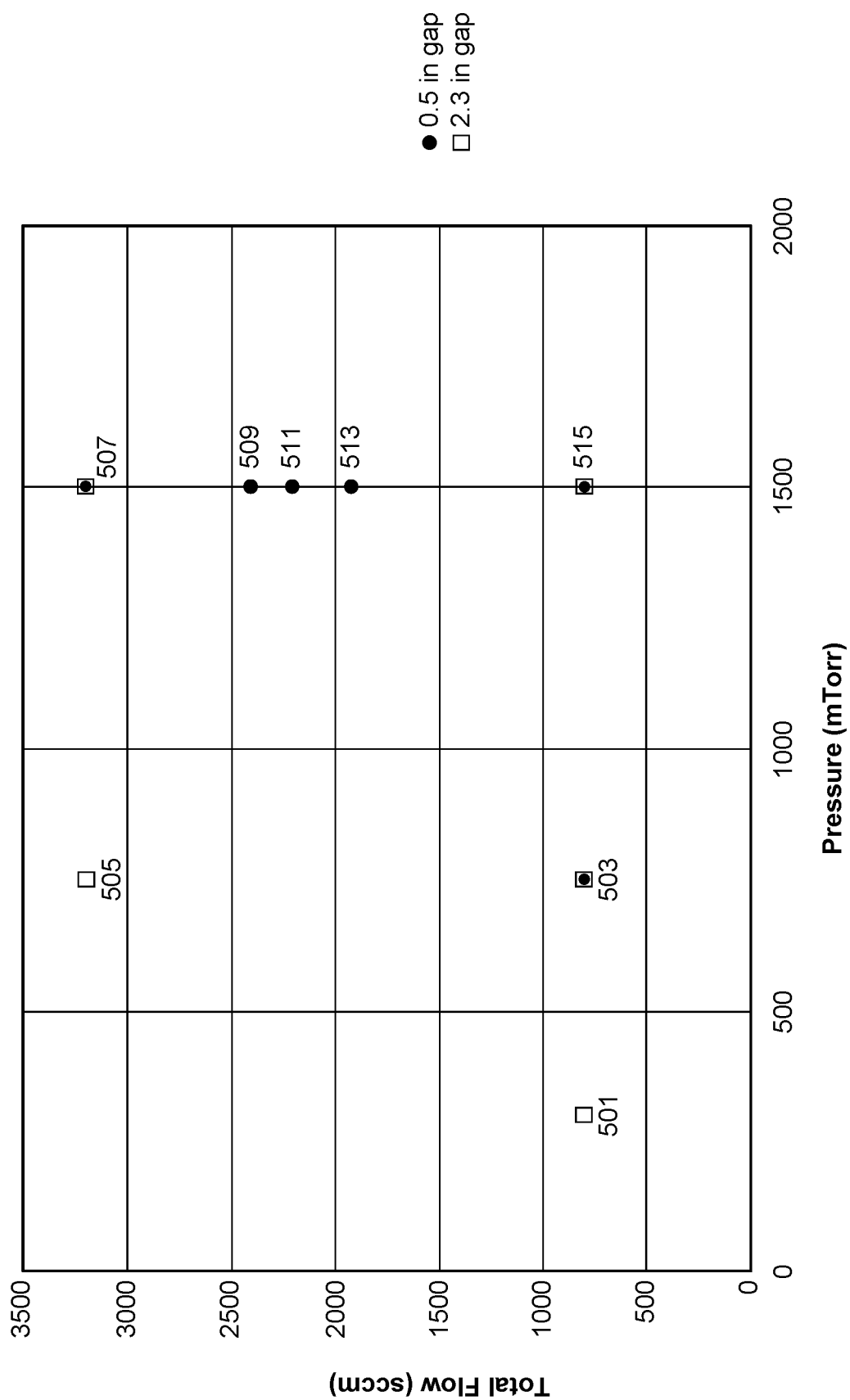
FIG. 5 is a graph depicting experimental results for an experiment conducted in accordance with certain disclosed embodiments.

An experiment was conducted for etching tungsten-doped carbon hard masks on substrates without a showerhead. Experimental data was collected for the effect of two z positions of a pedestal one with a 0.5 inch gap between the pedestal and a single-hole showerhead of the processing chamber, and one with a 2.3 inch gap. The results are depicted in FIG. 5 and below in Table 1. Each data point in FIG. 5 is represented by an experimental trial involving a pedestal position, chamber pressure, total flow of gases, and amount of chlorine in percentage of total flow of gases, which resulted in an average etch rate of the tungsten-doped carbon hard mask depicted in the last column of Table 1. For example, data point 501 represents a substrate on a pedestal set 2.3 inches away from a single-hole showerhead in a chamber set to a pressure of about 300 mTorr with about 800 sccm of total flow of gases, 0% of which was chlorine, resulting in an average etch rate of 0 nm/min. In another example, data point 503 represents two substrates that were set at different positions but were processed using the same total flow and pressure. Accordingly, the substrate at data point 503 where it was set on a pedestal that was 2.3 inches away from the single-hole showerhead involved a chamber pressure of about 750 mTorr, a total flow of about 800 sccm, where the chlorine percentage of the total flow was 40%, and the average etch rate of the tungsten-doped carbon-containing hard mask was 70 nm/min. The results of these experiments are depicted in Table 1 below, where data points correspond to FIG. 5.

TABLE 1

Effect of Two z-Positions of Pedestal

| Gap | Data Point | Chlorine % of total flow | Average Etch Rate (nm/min) |
|---|---|---|---|
| 2.3 in | 501 | 0 | 0 |
| 2.3 in | 503 | 40% | 70 |
| 2.3 in | 505 | 0 | 0 |
| 2.3 in | 507 | 25% | 35 |
| 2.3 in | 515 | 25% | 0 |
| 0.5 in | 503 | 40% | 0 |
| 0.5 in | 507 | 25% | 0 |
| 0.5 in | 509 | 40% | >140 |

TABLE 1-continued

Effect of Two z-Positions of Pedestal

| Gap | Data Point | Chlorine % of total flow | Average Etch Rate (nm/min) |
|---|---|---|---|
| 0.5 in | 511 | 44% | >140 |
| 0.5 in | 513 | 50% | >140 |
| 0.5 in | 515 | 40% | >140 |

As shown in these results, increased pressure resulted in a faster etch rate.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a substrate having a metal-doped carbon-containing material thereon, the method comprising:
   (a) providing the substrate to a process chamber,
      wherein the substrate is a semiconductor substrate and comprises the metal-doped carbon-containing material and an underlying material positioned below the metal-doped carbon-containing material, and
      wherein the metal-doped carbon-containing material and the underlying material each comprise negative features formed therein; and
   (b) after (a), simultaneously (i) heating the substrate to a temperature between about 200° C. and about 500° C., and (ii) exposing the metal-doped carbon-containing material to a plasma generated from a gas mixture comprising a first etching gas and a second etching gas to etch the metal-doped carbon-containing material,
      wherein the first etching gas forms a first volatile by product with the carbon of the metal-doped carbon-containing material,
      wherein the second etching gas forms a second volatile by product with the metal of the metal-doped carbon-containing material, and
      wherein the metal of the metal-doped carbon-containing material is selected from the group consisting of tungsten, titanium, tantalum, nitrides thereof, silicides thereof, and combinations thereof.

2. The method of claim 1, wherein the second etching gas comprises a halogen-containing gas selected from the group consisting of nitrogen trifluoride ($NF_3$), chlorine ($Cl_2$), fluorine ($F_2$), bromine ($Br_2$), iodine ($I_2$), sulfur hexafluoride ($SF_6$), and combinations thereof.

3. The method of claim 1, further comprising exposing the substrate to a pre oxidation gas comprising oxygen ($O_2$) and igniting an oxygen-based plasma to oxidize and thereby protect exposed silicon surfaces on the substrate, wherein the substrate is exposed to the pre oxidation gas while the negative features are present in the metal-doped carbon-containing material and in the underlying material, and before (b).

4. The method of claim 3, wherein the pre oxidation gas is a mixture of oxygen ($O_2$) and nitrogen ($N_2$).

5. The method of claim 1, wherein the metal-doped carbon-containing material comprises a metal dopant and density of the metal dopant in the metal-doped carbon-containing material in atomic percentage is between about 33% and about 66%.

6. The method of claim 1, wherein the plasma is ignited at a power per station of between about 500 W and about 10000 W.

7. The method of claim 1, wherein the metal-doped carbon-containing material is etched without applying a bias to a pedestal upon which the substrate is placed.

8. The method of claim 1, wherein the process chamber is set to a chamber pressure between about 100 mTorr and about 4000 mTorr.

9. The method of claim 8, wherein the process chamber is set to a chamber pressure between about 200 mTorr and about 4000 mTorr.

10. The method of claim 1, wherein percentage of metal in the metal-doped carbon-containing material is between about 5% and about 95%.

11. The method of claim 1, wherein the metal-doped carbon-containing material is a patterned hard mask used for forming the negative features in the underlying material, wherein the underlying material comprises a material selected from the group consisting of silicon oxide, silicon nitride, doped silicon oxide, doped silicon nitride, tungsten, and combinations thereof, wherein an etch selectivity of the metal-doped carbon-containing material relative to the underlying material is at least about 1000:1 during (b).

12. The method of claim 1, wherein the metal-doped carbon-containing material is a patterned hard mask used for forming the negative features in the underlying material, wherein the underlying material comprises a material selected from the group consisting of silicon oxide, silicon nitride, silicon, doped derivatives thereof, and combinations thereof, wherein an etch selectivity of the metal-doped carbon-containing material relative to the underlying material is at least about 1000:1 during (b).

13. The method of claim 1, wherein the metal-doped carbon-containing material is a patterned hard mask used for forming the negative features in the underlying material, wherein the underlying material comprises a material selected from the group consisting of silicon oxide, silicon nitride, silicon, germanium, doped derivatives thereof, and combinations thereof, wherein an etch selectivity of the metal-doped carbon-containing material relative to the underlying material is between about 10:1 and about 30:1 during (b).

14. The method of claim 1, wherein the metal-doped carbon-containing material is a patterned hard mask used for forming the negative features in the underlying material, wherein the underlying material comprises a material selected from the group consisting of silicon oxide, cobalt, tantalum nitride, copper, and low k dielectric, and combinations thereof, and wherein an etch selectivity of the metal-doped carbon-containing material relative to the underlying material is between about 10:1 and about 30:1.

15. The method of claim 1, wherein the plasma is ignited upstream of a showerhead for delivering the gas mixture.

16. The method of claim 1, wherein the metal-doped carbon-containing material is etched at an etch rate between about 30 nm/min and about 1000 nm/min.

17. The method of claim 1, wherein the metal-doped carbon-containing material has a ratio of metal to carbon, and a ratio of second etching gas volume to first etching gas volume is about equal to the ratio of metal to carbon in the metal-doped carbon-containing material.

18. The method of claim 1, wherein the second etching gas further comprises nitrogen gas ($N_2$).

19. The method of claim 1, wherein the second etching gas comprises a halogen-containing gas selected from the group consisting of nitrogen trifluoride ($NF_3$), fluorine ($F_2$), bromine ($Br_2$), iodine ($I_2$), sulfur hexafluoride ($SF_6$), and combinations thereof.

20. The method of claim 1, wherein the first etching gas comprises nitrogen ($N_2$); hydrogen ($H_2$); nitrous oxide ($N_2O$); oxygen ($O_2$) and nitrogen ($N_2$); oxygen ($O_2$) and nitrous oxide ($N_2O$); oxygen ($O_2$) and water vapor ($H_2O$); oxygen ($O_2$), water vapor ($H_2O$), and nitrous oxide ($N_2O$); or nitrogen ($N_2$) and hydrogen ($H_2$).

21. The method of claim 1, wherein the first etching gas comprises a gas selected from the group consisting of nitrogen ($N_2$), hydrogen ($H_2$), nitrous oxide ($N_2O$), and water vapor ($H_2O$).

22. A method of etching a tungsten doped carbon hard mask on a substrate, the method comprising:
   (a) providing the substrate to a process chamber, wherein the substrate comprises the tungsten doped carbon hard mask positioned over an underlying material, and wherein the tungsten doped carbon hard mask and the underlying material each comprise negative features formed therein; and
   (b) after (a), simultaneously (i) heating the substrate to a temperature between about 200° C. and about 500° C., and (ii) exposing the tungsten doped carbon hard mask to a plasma generated from a gas mixture of oxygen and chlorine to etch the tungsten doped carbon hard mask by forming tungsten chlorides or tungsten oxychlorides.

23. The method of claim 22, wherein the plasma is ignited using a power per station of between about 500 W and about 10000 W.

24. The method of claim 22, wherein a composition of a total flow of gases flowed to the process chamber when exposing the tungsten doped carbon hard mask to the plasma comprises at least about 10% chlorine.

25. The method of claim 22, wherein the process chamber is set to a chamber pressure between about 100 mTorr and about 4000 mTorr.

26. The method of claim 22, wherein the gas mixture further comprises nitrogen gas ($N_2$).

* * * * *